US009946664B2

(12) United States Patent
Shaeffer et al.

(10) Patent No.: US 9,946,664 B2
(45) Date of Patent: *Apr. 17, 2018

(54) SOCKET INTERPOSER HAVING A MULTI-MODAL I/O INTERFACE

(71) Applicant: Samsung Electronics Co., Ltd., Gyeonggi-do (KR)

(72) Inventors: Ian P. Shaeffer, Los Gatos, CA (US); Zhan Ping, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 806 days.

This patent is subject to a terminal disclaimer.

(21) Appl. No.: 14/454,309

(22) Filed: Aug. 7, 2014

(65) Prior Publication Data

US 2015/0134868 A1    May 14, 2015

Related U.S. Application Data

(60) Provisional application No. 61/902,035, filed on Nov. 8, 2013.

(51) Int. Cl.
*G06F 13/12* (2006.01)
*G06F 13/40* (2006.01)
*G11C 7/10* (2006.01)

(52) U.S. Cl.
CPC ........ *G06F 13/126* (2013.01); *G06F 13/4022* (2013.01); *G06F 13/4063* (2013.01); *G11C 7/1075* (2013.01)

(58) Field of Classification Search
CPC .... G06F 13/409; G06F 13/00; G06F 13/4081; G06F 13/382; G06F 13/4022

USPC .......................... 710/300–306, 100; 361/719
See application file for complete search history.

(56) References Cited

U.S. PATENT DOCUMENTS

| | | | |
|---|---|---|---|
| 5,440,755 A * | 8/1995 | Harwer | H05K 1/14 710/105 |
| 6,715,094 B2 | 3/2004 | Jacobs | |
| 6,772,261 B1 * | 8/2004 | D'Antonio | G11C 29/48 365/63 |
| 7,913,010 B2 | 3/2011 | Hoover | |

(Continued)

FOREIGN PATENT DOCUMENTS

WO    WO2012064670 A1    5/2012

*Primary Examiner* — Tim T Vo
*Assistant Examiner* — Kim T. Huynh
(74) *Attorney, Agent, or Firm* — Convergent Law Group LLP (57) ABSTRACT

Exemplary embodiments include a socket interposer having a plurality of connectors configured to attach to a server board, the server board including: a first processor socket having a processor form factor, and a first memory associated with the first processor socket, a processor inserted into the at least first processor socket, the processor having access to the first memory, and a second processor socket having the processor form factor, and a second memory associated with the second processor socket, wherein the plurality of connectors are configured to fit the processor form factor; and a multi-modal I/O interface having a first mode and a second mode, wherein in the first mode provides processor-to-processor communication, and the second mode provides the first processor with accessibility to the second memory associated with the second processor socket.

19 Claims, 4 Drawing Sheets

(56) References Cited

U.S. PATENT DOCUMENTS

| | | |
|---|---|---|
| 7,925,854 B2 | 4/2011 | Oh |
| 8,230,145 B2 | 7/2012 | Bresniker |
| 8,289,760 B2 | 10/2012 | Jeddeloh |
| 2010/0185668 A1 | 7/2010 | Murphy |
| 2011/0096786 A1* | 4/2011 | Brueggen ............ H04L 49/552 370/400 |
| 2013/0114363 A1 | 5/2013 | Amirkhany |
| 2013/0138844 A1* | 5/2013 | Karamcheti ............ G06F 13/12 710/74 |

* cited by examiner

SOCKET INTERPOSER HAVING A MULTI-MODAL I/O INTERFACE

CROSS-REFERENCE TO RELATED APPLICATIONS

This application claims the benefit of U.S. Provisional Patent Application No. 61/902,035, filed Nov. 8, 2013 and is incorporated herein by reference.

BACKGROUND

In current data centers, the use of multi-processor servers is very popular. Each server typically includes a circuit board having a number of sockets configured to fit various components, including multiple processors or CPUs, an interface for performing external communication, and various other components. Some of these may be incorporated into the circuit board or may fit into dedicated socket(s) on the circuit board. The CPUs include connectors having a form factor that mates with CPU sockets on the circuit board. Stated differently, the CPU sockets on the circuit board have the same form factor as the connectors (or pins) for the CPU. In operation, each server board performs calculations using at least its internal CPUs.

In recent server architectures, each CPU/socket on the circuit board is coupled to a dedicated memory, such as a dual in-line memory module (DIMM), to provide faster access to items in the dedicated memory. Consequently, the DIMM for the first CPU is usable only by the first CPU and the DIMM for the second CPUs usable only by the second CPU.

One problem with multiple processor servers is that some server applications may not require use of multiple CPUs. If a single CPU is adequate for the computational needs, a second socket in the circuit board may be left empty. Use of a single CPU in the server board may reduce the power consumption, which is generally desirable. There is also a cost savings due to the omission of the second CPU. However, because each CPU socket and thus each CPU typically has dedicated memory, leaving one of the CPU sockets empty may preclude access to the dedicated memory assigned to the empty CPU socket and a portion of the total memory capacity of the server may be lost. Thus, the reduction in power and cost achieved by omitting a CPU may be offset by limitations in the memory for the server board for many applications which require large memories but are not calculation intensive.

Accordingly, it would be desirable to accommodate omitting one or more CPUs from a multi-I processor server board, while maintaining accessibility to the dedicated memory assigned to the empty CPU sockets.

BRIEF SUMMARY

Exemplary embodiments include a socket interposer having a plurality of connectors configured to attach to a server board, the server board including: a first processor socket having a processor form factor, and a first memory associated with the first processor socket, a processor inserted into the at least first processor socket, the processor having access to the first memory, and at least a second processor socket having the processor form factor, and a second memory associated with the second processor socket, wherein the plurality of connectors are configured to fit the processor form factor; and a multi-modal I/O interface having a first mode and a second mode, wherein in the first mode provides processor-to-processor communication, and the second mode provides the first processor with accessibility to the second memory associated with the second processor socket.

According to the method and system disclosed herein, the exemplary embodiments provide a mechanism for extending the functionality of a circuit board using preexisting processor socket(s). For example, inserting the socket interposer into an empty processor socket enables server systems to increase the amount of memory in the system, while maintaining low latency and high interconnect bandwidth.

DETAILED DESCRIPTION

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Advantages and features of the present invention and methods of accomplishing the same may be understood more readily by reference to the following detailed description of embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims. In the drawings, the thickness of layers and regions are exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

The term "component" or "module", as used herein, means, but is not limited to, a software or hardware component, such as a field programmable gate array (FPGA) or an application specific integrated circuit (ASIC), which performs certain tasks. A component or module may advantageously be configured to reside in the addressable storage medium and configured to execute on one or more processors. Thus, a component or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for the components and components or modules may be combined into fewer components and components or modules or further separated into additional components and components or modules.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The exemplary embodiments provide a server board having first and second processor sockets and dedicated memory associated with each of the first and second processor sockets. A first processor is inserted into the first processor socket, and a socket interposer is inserted into the second processor socket in place of a second processor to provide the first processor with accessibility to the dedicated memory associated with the second processor socket via a multi-modal input/output (I/O) interface may have a first mode and a second mode, wherein in the first mode provides processor-to-processor communication, and the second mode provides the first processor with accessibility to the second memory associated with the second processor socket.

Figure 1:
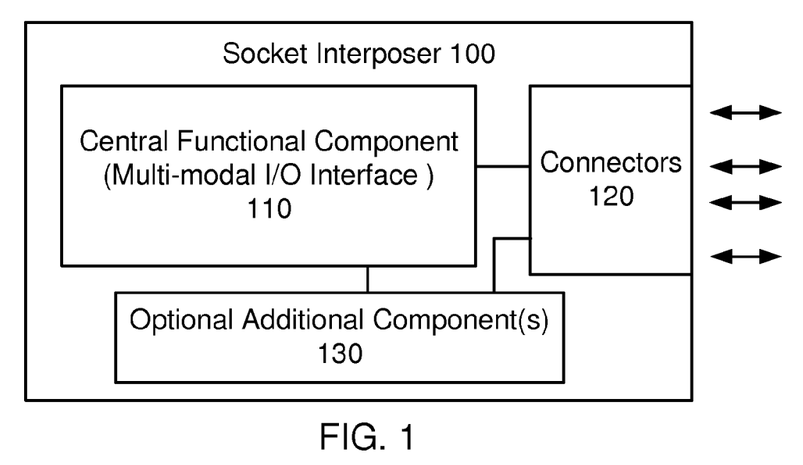
FIG. 1 is a block diagram of an exemplary embodiment of a socket interposer.
Figure 2:
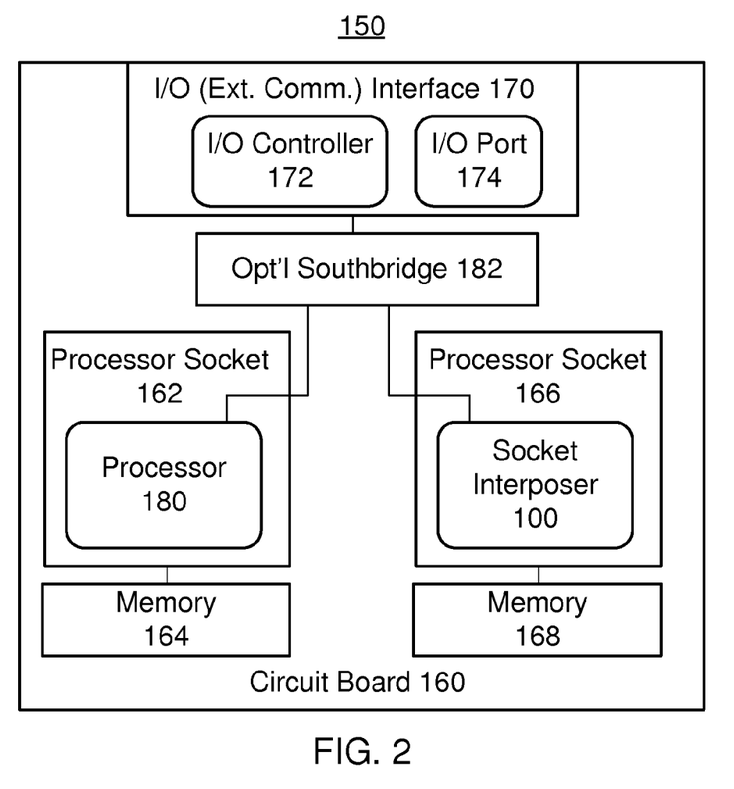
FIG. 2 depicts a computer system in which the socket interposer may be employed and operated.

FIG. 1 is a block diagram illustrating an exemplary embodiment of a socket interposer 100; and FIG. 2 depicts a computer system 150 in which the socket interposer 100 may be employed and operated. The computer system 150 may be a server board that may be part of a data center or other server application. In other embodiments, however, the computer system 150 may reside in another environment and/or perform other functions.

Referring to FIGS. 1-2, the computer system 150 includes a circuit board 160, processor 180, and optional external communication interface 170, and optional southbridge 182. The circuit board 160 includes processor sockets 162 and 166 having processor form factors. The processor 180 (or CPU) has pins (not shown in FIG. 2) having a form factor configured to fit the form factor of the processor socket 162, such that the processor 180 may be inserted or plugged into the processor socket 162 for the computer system 160 to function as a server board. The circuit board 160 also includes dedicated memory 164 associated with the processor 180/processor socket 162. In some embodiments, the dedicated memory 164 is a dual in-line memory module (DIMM) plugged into a DIMM slot on the circuit board 160. However, in other embodiments, the dedicated memory 164 may be provided in another manner.

The circuit board 166 also includes a second processor socket 166 having a processor form factor that is typically associated with a second processor (not shown) and a dedicated memory 168. The processor socket 166 has a number of connectors configured to attach to the server board and receive pins of a processor form factor, such as a second processor or CPU. The connectors may also connect the module placed in the processor socket 166 to, among other components, the memory 168. In one embodiment, the memory 168 associated with the processor socket 166 may comprise a DIMM plugged into a DIMM slot on the circuit board 160. In alternative embodiments, the dedicated memory 164 may be provided in another manner.

According to the exemplary embodiments, the processor 180 is inserted into processor socket 162, and the socket interposer 100 is inserted into the second processor socket 166 in place of the second processor to provide the remaining processor 180 with accessibility to the dedicated memory 168 assigned to the second processor socket 166, as described further below.

In other embodiments, the socket 166 may be associated with optional socket resources for configuration with for another type of module. Also shown in the computer system 150 is input/output (I/O) interface 170. Essentially, the I/O interface 170 is used for external communication. The I/O interface 170 includes I/O port(s) 174 and I/O controller 172. In some embodiments, the I/O controller 172 is an Ethernet controller. In other embodiments, other controllers using other protocols for external communication may be used.

The socket interposer 100 includes a central functional component 110, connectors 120 and optional additional component(s) 130. The connectors 120 include a number of pins having a configuration, or form factor, configured to fit the processor socket 166 on the computer system 150. Stated differently, the socket interposer 100 may be plugged into the processor socket 166 and will function within the computer system 150. For example, the connectors 120 of the socket interposer 100 have the same form factor as a processor configured to fit into the processor socket 166.

The central functional component 110 performs various functions for the computer system 150. According to the exemplary embodiment, the central functional component 110 comprises a multi-modal I/O interface having at least two modes. In one mode, the multi-modal I/O interface may provide processor-to-processor communication. In the second mode, the interface may provide the processor 180 with accessibility to the memory 168 associated with the processor socket 166. The processor 180 may optionally route memory traffic using the multi-modal I/O interface through a low latency path between a memory controller and a physical layer (PHY) and encode data with a different interface protocol to support lower latency routing of the memory traffic from the processor 180 through a memory controller and to the memory 168 dedicated to the processor socket 166.

Accordingly, the functions performed by the socket interposer 100 and, therefore, the central functional component 110, are different from those performed by the processor that would otherwise occupy processor socket 166.

The socket interposer 100 may also include optional additional component(s) 130. The optional additional component(s) 130 may include flash memory or an external communication controller, such as an Ethernet controller, an InfiniBand controller, an optical communication controller and/or another type of communication controller. The central functional component 110 may also include other sub-components such as one or more ports (not explicitly shown in FIG. 1) and may have other and/or additional functions.

The socket interposer 100 may enhance the functionality of the computer system 150. The preexisting circuit board 160 having preexisting socket 166 may be provided with the new functions of the socket interposer 100. In particular, processor socket 166 designed for use with a processor may be used to perform another set of functions using the socket interposer 100. For example, when the socket 166 is a CPU socket and the computer system 150 is used in a server application for which one CPU is sufficient, then the cost of an additional processor may be saved. Instead, a single processor 180 may be used. Such a server board 150 may also have reduced power consumption. Using the socket interposer 100, the memory 168 that would be unavailable if the socket 166 were left open are now available. For example, DIMM for the processor socket 166 may now be accessible to the processor 180 via the socket interposer 100. Low latency access to the memory 168 that would otherwise be unavailable may thus be obtained. In an embodiment where the socket interposer 100 is provided with on-board memory, then the memory capacity of the computer system 150 may also be enhanced.

If the socket interposer 100 includes an external communication controller such as an Ethernet controller, then access to the memory of the computer system 150 may be more rapidly made through both the I/O interface 170 and the socket interposer 100. For example, the processor 180 may opt to use the I/O interface through the external communication controller in the socket interposer 100 if the latency of the I/O interface is greater than a particular threshold. Faster communication may be preserved. Thus, lower latency communication between server boards may be achieved. One or more of these benefits may be attained without impacting the design and implementation of preexisting circuit board 160 and preexisting computer systems 150.

Figure 3:
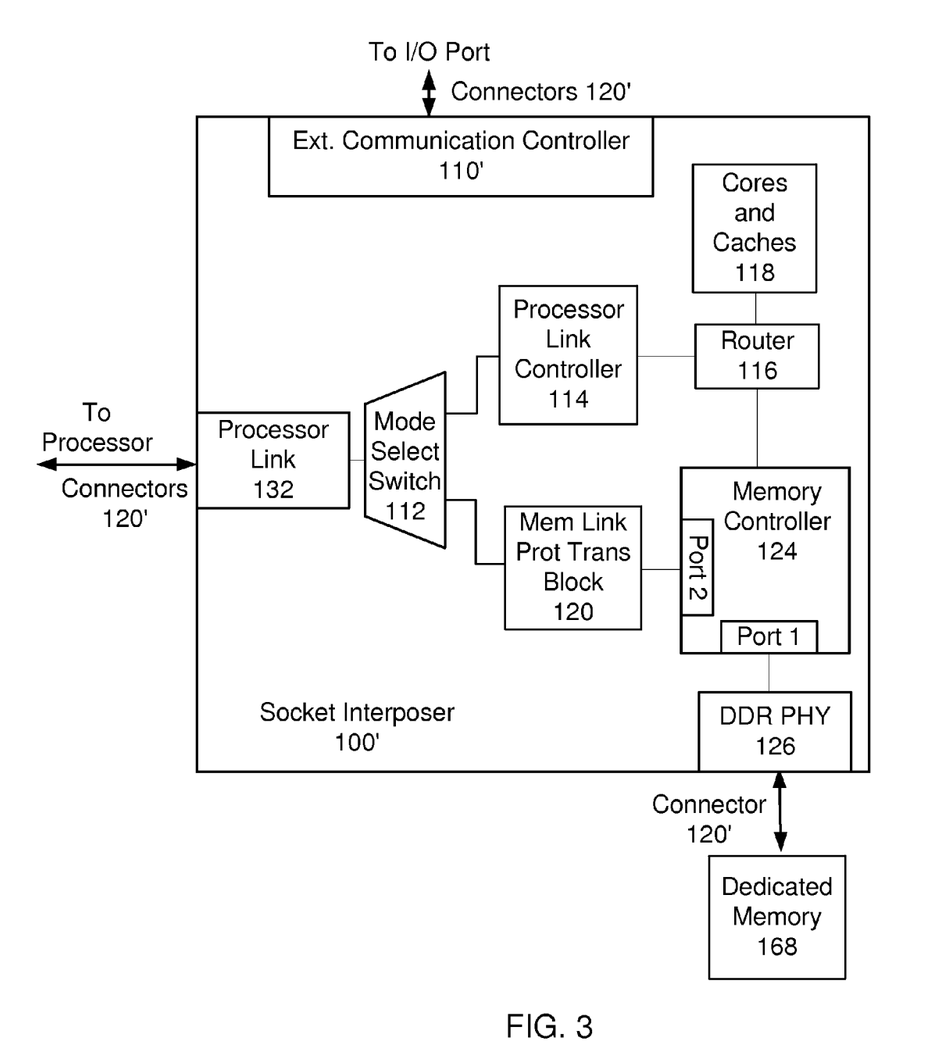
FIG. 3 is a block diagram of another exemplary embodiment of a socket interposer.

FIG. 3 is a block diagram illustrating an exemplary embodiment of a socket interposer 100'. As described above, the socket interposer 100' may include an external communication controller 110' and connectors 120'. However, according to the exemplary embodiment, the multi-modal I/O interface of the socket interposer 100' may comprise a processor link 132, a mode select switch 112, a processor link controller 114, a router 116, cores and caches 118, a memory link protocol translation block 120, a multi-port memory controller 124, and a double data rate (DDR) physical interface (PHY) 126.

The processor link 132, the mode select switch 112, the processor link controller 114, the router 116, the cores and caches 108, the memory link protocol translation block 120, the memory controller 124 and the DDR PHY 126 may be exemplary embodiments of the central functional component 110 depicted in FIG. 1. The external communication controller 110' may correspond to optional additional component(s) 130 depicted in FIG. 1. In addition to what is shown, the connectors 120' include a number of pins having a configuration, or form factor, configured to fit the processor socket 166 on the computer system 150, such that the socket interposer 100' may be inserted into the processor socket 166 and function within the server board 150.

The processor link 132 may be used to provide an inter-processor link to provide communication directly with the processor. The processor 180 may therefore communicate via the I/O interface 170 (FIG. 2) and/or the socket interposer 100'. In one embodiment, the processor link 132 may comprise a quick path interconnect (QPI) developed by Intel™. In another embodiment, the processor link 132 may comprise HyperTransport developed by Advanced Micro Devices™. However, the processor link 132 could be any high-speed link generally used for another purpose. Examples include an I/O link (e.g., PCIe), a storage link (e.g. SAS), or even another memory interface normally configured to attach directly to DRAM component or modules).

The processor link 132 may utilize various types of processor link protocols, including a serialized memory protocol (e.g. serialized DDR4), packetized, wormhole routing protocol and the like.

As illustrated below, the exemplary embodiments enable the processor 180 to be optimized for operating with the socket interposer 100' by allowing the inter-processor link to be multi-modal, where in one mode, the link supports normal functionality (inter-processor communication), while in a second mode (memory mode), the link operates as a high-speed, dedicated memory link between the processor 180 and the memory 168 dedicated to the socket 166 of the socket interposer.

Inter-processor links, such as QPI, are not optimized in the same way as a memory link would be. For example, inter-processor links are generally fairly symmetric, since either processor can be the "master" of a request at a given time. However, memory links tend to be fairly simple with regards to protocol and are generally asymmetric. The memory controller on the processor is always the "master," making requests of the memory. As such, optimizations can be made to the protocol of the multi-modal link when operating in a memory mode to make it more efficient in that mode.

Similarly, when the processor link 132 is dedicated to memory, it generally makes sense for the memory controller to more tightly couple to that link to reduce latency. When operating in memory mode, the memory controller may have full ownership of that link and a low-latency path to get to the dedicated memory (rather than passing through an internal ring or mesh network).

Accordingly, the mode select switch 112 switches operation of the socket interposer 100' between an inter-processor communication mode and a memory mode. In one embodiment, the mode select switch 112 may be set in a variety of ways. In one embodiment, the mode select switch 112 may be set through the processor 180 using a processor link command (e.g., a QPI command) to set the mode. In another embodiment, the mode select switch 112 may be set manually by connecting to a separate controller and entering a remote access from data center management to provide the mode select.

The mode select switch 112, which is coupled to the processor link 132, provides two paths corresponding to the two modes of the multi-modal I/O interface. When the mode select switch 112 selects the inter-processor communication mode, an inter-processor communication path is followed from the mode select switch 112 comprising the processor link controller 114 coupled to the router 116, and the router 116 coupled to the cores and caches 118. In this mode, inter-processor communication proceeds as usual, in which communication is routed to the processor link controller 114, through the router 116 into the cores and caches 118. The inter-processor communication mode is a lower latency and more computing focused application. In one embodiment, the processor link controller 114 may comprise a QPI controller or a hypertransport controller.

When the memory mode is selected, a memory mode path enables processor 180 to access the dedicated memory by bypassing the processor link controller 114. The memory mode path from the mode select switch 112 comprises the memory link protocol translation block 120 coupled to the memory controller 124, and the memory controller 124 coupled to the DDR PHY 126. The memory mode provides lower latency and direct access from the processor 180 to the dedicated memory 168.

The function of the memory link protocol translation block 120 is to perform memory protocol generation that encodes data from the processor 180 with a different interface protocol to support lower latency routing of memory traffic from the processor 180 to the memory controller 124 and to the actual dedicated memory 168. Although the memory link protocol translation block 120 is shown separate from the processor link controller 114, in an alternative embodiment, memory protocol generation may be handled modally by the processor link controller 114 in order to ease physical design.

According to one embodiment, the multi-port memory controller 124 includes one port, Port 1, that couples the memory controller 124 to the dedicated memory 168 through the DDR PHY 126 and the connector(s) 120'. The multi-port memory controller 124 is further provided with a second port, Port 2, for coupling the memory controller 124 to the memory link protocol translation block 120 and to the processor 180 through the processor link 132. As a result, lower latency communication is provided in between the dedicated memory 168 and the processor 180. In another embodiment, the contents of the memory 168 may be provided directly to the external communication controller 110' and/or the processor link 132.

In a further embodiment, the memory link protocol translation block 120 may be coupled directly to the DDR PHY 126.

Figure 4A:
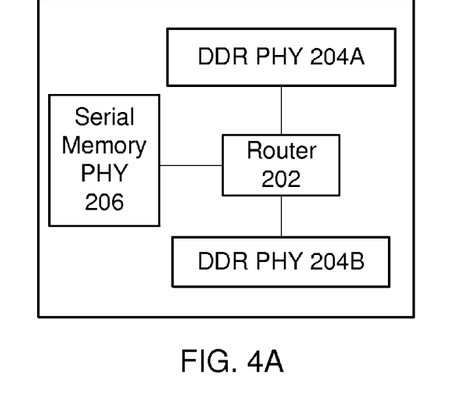
FIGS. 4A-4C are block diagrams illustrating different memory buffer configurations that may be implemented using the socket interposer and the multi-modal I/O interface.
Figure 4B:
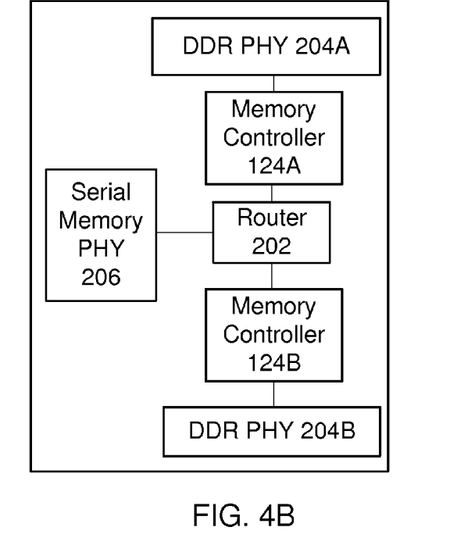
Figure 4C:
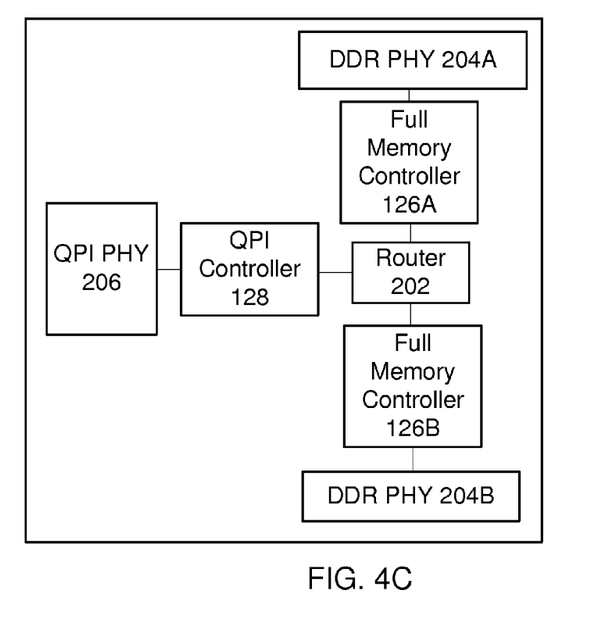

The multi-modal I/O interface implementation may vary depending on the architecture of the processor memory controller and link. FIGS. 4A-4C are block diagrams illustrating different memory buffer configurations that may be implemented using the socket interposer and the multi-modal I/O interface.

FIG. 4A is a block diagram illustrating a very simple memory buffer that may be implemented on the socket interposer. In general, optimizations to the memory mode of the multi-modal I/O interface should allow the socket interposer 100' to be "lighter weight" than a full QPI compatible memory buffer. The example shown in FIG. 4A shows that it may be possible to remove memory controllers completely from the socket interposer, and have a router 202 coupled to a serial memory PHY 206 and to DDR PHY 204A and 204B. In one embodiment, the link protocol between the processor 180 and socket interposer could be a serialized memory device protocol (e.g. DDR4). In this case, the socket interposer simply deserializes incoming traffic from the processor 180 and routes requests to one of DDR PHYS on the socket interposer. In this embodiment, a memory controller on the processor 180 may fully manage the memory 168 attached to the socket interposer 100'. In this environment, commands going to the router 202 already may include memory controller information, and the router 202 passes the commands from the serial memory PHY 206.

FIG. 4B is a block diagram illustrating a simplified memory link buffer. The simplified memory link buffer is similar to that shown in FIG. 4A but further includes two simple memory controllers 124A and 124B coupled between the router 202 and the DDR PHY 204A and 204B, respectively, to provide a command to the DDR PHY and also determine what timing protocols to follow. This example shows that in some cases, it still may be desirable to have one or more simple memory controllers locally on the socket interposer, but primarily to manage memory timing such as refresh, RAS/CAS timing, and the like.

FIG. 4C is a block diagram illustrating a full QPI memory buffer. The full QPI memory buffer may comprise a QPI controller 128 coupled to a QPI PHY 206, a router 202 coupled to the QPI controller 128 and coupled to full memory controllers 126A and 126B, which in turn are coupled to DDR PHY 204A and 204B, respectively. The QPI controller 128 may be used to control timing protocols to translate requests into memory packets, and the router 202 routes the memory packets to the appropriate PHY.

Additional embodiments of the present invention may include the following:

Memory buffers may have varying levels of memory controller functionality, including none at all.

The processor 180 may have separate protocol generators/link-layers/controllers for the multi-modal link, or a single controller may be multi-modal.

Although the exemplary embodiment has been explained in terms of a multi-port memory controller 124 handling one or more native memory interfaces (e.g. DDR4), in an alternative embodiment there could be dedicated memory controllers for native memory as well as memory to be accessed over the multi-modal link.

The optional external communication controller 110' may be an Ethernet controller, an InfiniBand controller, an optical communication controller and/or another type of communication controller. The external communication controller 110' may also include other subcomponents such as one or more ports (not separately shown in FIG. 3). The external communication controller 110' may be used to provide direct access to other server boards. Thus, the external communication controller 110' may be used to provide an I/O interface through the socket 166'.

The socket interposer 100 may enhance the functionality of the computer system 150 shown in FIG. 1. The preexisting circuit board 160 having preexisting processor socket 166 may be provided with the new functions of the socket interposer 100. In particular, the server board 150 may use a single processor 180, thus saving the cost of an additional processor. The server board 150' may also have reduced power consumption. Using the socket interposer 100, the dedicated memory 168 that would be unavailable if the socket 166 were left open is now available through the interposer 100. Because of the external communication controller 110, access to the memory of the computer system 150 may be more rapidly made through both the I/O interface 170 and the socket interposer 100. For example, the processor 180 may opt to use the I/O interface through the external communication controller 110 in the socket interposer 100 if the latency of the I/O interface is greater than a particular threshold. In some embodiments accesses to the memory 168 may always be made through the controller 110. Such accesses generally have lower latency than accesses of the memory 168 through I/O interface 170 and processor 180. In other embodiments, accesses to the memory 168 may be made through the controller 110 if the latency of such an access through the I/O interface 170 exceeds a threshold or if the latency of an access of the memory 168 through the I/O interface 170 exceeds another threshold. Thus, lower latency communication between server boards may be achieved. One or more of these benefits may be attained without impacting the design and implementation of preexisting circuit board 160 and preexisting computer systems 150.

Figure 5:
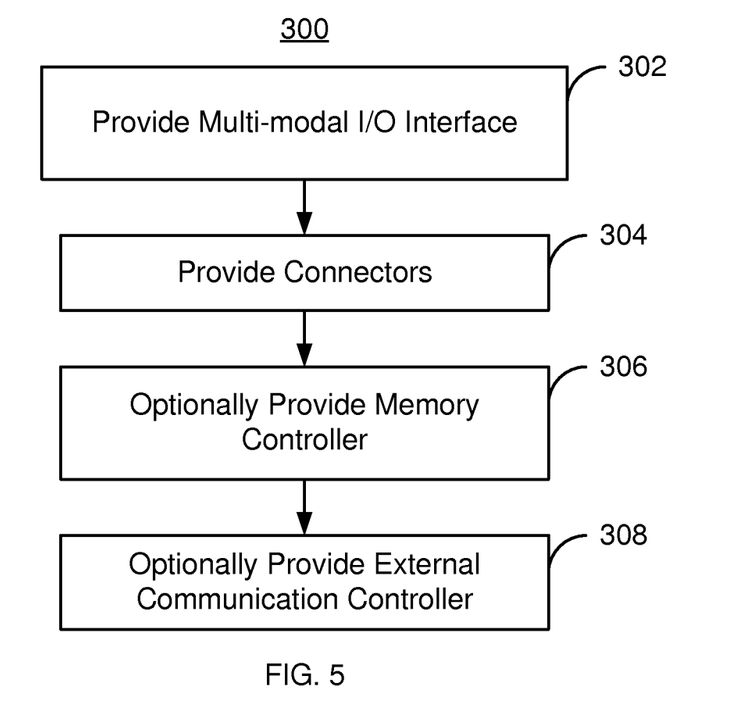
FIG. 5 is a flow chart depicting an exemplary embodiment of a method for providing a socket interposer.

FIG. 5 is a flow chart depicting an exemplary embodiment of a method 300 for fabricating a socket interposer such as the socket interposer 100 and 100'. For simplicity, some steps may be omitted or combined. The method 300 is described in the context of the socket interposer 100. However, the method 300 may be used for other socket interposers.

The functional component 110 including the multi-modal I/O interface is provided on the socket, via step 302. Step 302 may include providing the processor link 132, the mode select switch 112, the processor link controller 114, the router 116, cores and caches 118, the memory link protocol translation block 120, the multi-port memory controller 124, and the double data rate (DDR) physical interface (PHY) 126. The connectors 130 are provided for the socket interposer 100, via step 304. Step 130 includes configuring the connectors to have the desired form factor. For example, the connectors 130 may be configured for a processor socket. Optional additional component(s) 130 may be provided in steps 306 and 308. For example, an on-board memory may be provided, via step 306 and/or an external communication controller may be provided in step 308. Steps 306 and 308 may include connecting the memory and/or external communication controller to the desired pins/connectors for the socket interposer 100.

Using the method 300, the socket interposer 100, 100' and/or an analogous socket interposer may be provided. Thus, one or more of the benefits described herein may be achieved.

Figure 6:
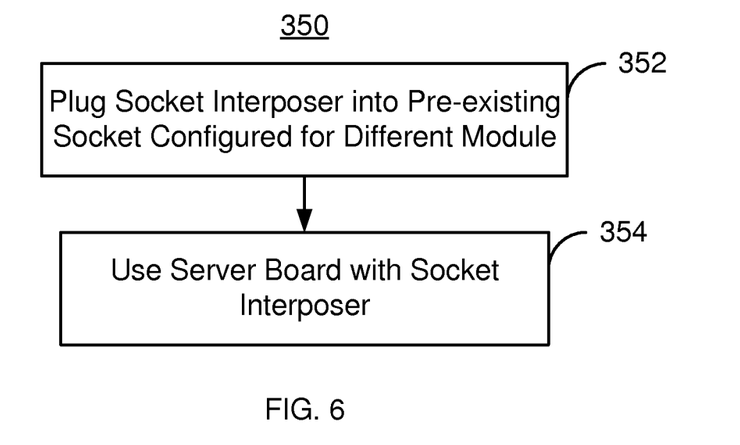
FIG. 6 is a flow chart depicting an exemplary embodiment of a method for using a socket interposer.

FIG. 6 is a flow chart depicting an exemplary embodiment of a method 350 for using a socket interposer such as the socket interposer 100 and 100'. For simplicity, some steps may be omitted or combined. The method 350 is described in the context of the socket interposer 100 and computer system 150. However, the method 250 may be used for other socket interposers and/or other computer systems.

The socket interposer 100 is plugged into the appropriate, preexisting socket 166 of the computer system 150, via step 352. The socket interposer 100 is thus plugged into a socket designed and fabricated for another component, i.e. a processor. The computer system 150, or server board, is then operating with the socket interposer 100 in place, via step 354.

Using the method 350, the socket interposer 100, 100' and/or an analogous socket interposer may be connected with the desired computer system 150 and/or analogous computer system. Thus, the computer system may enjoy better function and/or performance. For example, the latency of communication may be reduced and/or the memory resource available may be enhanced. As a result, performance of the computer system may be improved.

A method and system for socket interposer having a multi-modal I/O interface has been disclosed. The present invention has been described in accordance with the embodiments shown, and there could be variations to the embodiments, and any variations would be within the spirit and scope of the present invention. Accordingly, many modifications may be made by one of ordinary skill in the art without departing from the spirit and scope of the appended claims.

We claim:

1. A socket interposer, comprising:
a plurality of connectors configured to attach to a server board, the server board including:
a first processor socket having a processor form factor, and a first memory associated with the first processor socket,
a first processor inserted into the first processor socket, the processor having access to the first memory, and
a second processor socket having the processor form factor, and a second memory associated with the second processor socket,
wherein the plurality of connectors are configured to fit the processor form factor and are inserted into the second processor socket in place of a second processor; and a multi-modal I/O interface having a first mode and a second mode, the multi-modal interface including a processor link controller, a router, cores and caches, the first mode being an inter-processor communication mode, the second mode being a memory mode, wherein the first mode provides an inter-processor link to provide communication with the first processor via the socket interposer and the second mode provides the first processor with accessibility to the second memory associated with the second processor socket,
wherein the first mode includes an inter-processor communication path such that inter-processor communication is routed to the processor link controller through the router into the cores and caches.

2. The socket interposer of claim 1 wherein the multi-model I/O interface further comprises:
a processor link, a mode select switch, a memory link protocol translation block, a multi-port memory controller, and a double data rate (DDR) physical interface (PHY).

3. The socket interposer of claim 2 wherein the mode select switch is coupled to the processor link and switches operation of the socket interposer between the inter-processor communication mode and the memory mode.

4. The socket interposer of claim 3 wherein when the mode select switch selects the inter-processor communication mode, the inter-processor communication path is followed.

5. The socket interposer of claim 3 wherein when the mode select switch selects the memory mode, a memory mode path is followed comprising the memory link protocol translation block coupled to the memory controller, and the memory controller coupled to the DDR PHY.

6. The socket interposer of claim 2 wherein the memory link protocol translation block performs memory protocol generation.

7. The socket interposer of claim 2 wherein the memory link protocol translation block performs memory protocol generation and is handled modally by the processor link controller.

8. The socket interposer of claim 2 wherein the multi-port memory controller includes a first port that couples the multi-part memory controller to the second memory through the DDR PHY and the connectors, and further includes a second port that couples the multi-part memory controller to the memory link protocol translation block and to the first processor through the processor link.

9. The socket interposer of claim 2 wherein the processor link utilizes a type of processor link protocol, including at least one of a serialized memory protocol, packetized, and wormhole routing protocol.

10. A circuit board comprising:
a first processor socket having a processor form factor, and a first memory associated with the first processor socket;
a first processor inserted into the first processor socket, the processor having access to the first memory;
a second processor socket having the processor form factor, and a second memory associated with the second processor socket; and a socket interposer inserted into the second processor socket via a plurality of connectors configured to fit with the processor form factor, the socket interposer further comprising:
  a multi-modal I/O interface having a first mode and a second mode the multi-modal interface including a processor link controller, a router, cores and caches, wherein in the first mode provides an inter-processor link to provide communication with the first processor via the socket interposer, and the second mode provides the first processor with accessibility to the second memory associated with the second processor socket, the first mode being an inter-processor communication mode, the second mode being a memory mode, wherein the first mode includes an inter-processor communication path such that inter-processor communication is routed to the processor link controller through the router into the cores and caches.

11. The circuit board of claim 10 wherein the multi-model I/O interface comprises:
  a processor link, a mode select switch, a memory link protocol translation block, a multi-port memory controller, and a double data rate (DDR) physical interface (PHY).

12. The circuit board of claim 11 wherein the mode select switch is coupled to the processor link and switches operation of the socket interposer between the inter-processor communication mode and the memory mode.

13. The circuit board of claim 12 wherein when the mode select switch selects the inter-processor communication mode, the inter-processor communication path is followed.

14. The circuit board of claim 12 wherein when the mode select switch selects the memory mode, a memory mode path is followed comprising the memory link protocol translation block coupled to the memory controller, and the memory controller coupled to the DDR PHY.

15. The circuit board of claim 11 wherein the memory link protocol translation block performs memory protocol generation.

16. The circuit board of claim 11 wherein the memory link protocol translation block performs memory protocol generation and is handled modally by the processor link controller.

17. The circuit board of claim 11 wherein the multi-port memory controller includes a first port that couples the multi-part memory controller to the second memory through the DDR PHY and the connectors, and further includes a second port that couples the multi-part memory controller to the memory link protocol translation block and to the first processor through the processor link.

18. The circuit board of claim 11 wherein the processor link utilizes a type of processor link protocol, including at least one of a serialized memory protocol, packetized, and wormhole routing protocol.

19. A method for providing a computer system comprising:
  plugging a socket interposer into a socket of a circuit board of the computer system, the socket interposer including a plurality of connectors configured to fit with a form factor of the socket, the computer system board comprising:
    a first processor socket having a processor form factor, and a first memory associated with the first processor socket;
    a processor inserted into the first processor socket, the processor having access to the first memory;
    a second processor socket having the processor form factor, and a second memory associated with the second processor socket; and
  wherein the socket interposer is inserted into the second processor socket via a plurality of connectors configured to fit with the processor form factor, the socket interposer further comprising a multi-modal I/O interface having a first mode and a second mode, the multi-modal interface including a processor link controller, a router, cores and caches, wherein in the first mode provides an inter-processor link to provide communication with the first processor via the socket interposer, and the second mode provides the first processor with accessibility to the second memory associated with the second processor socket,
  wherein the first mode includes an inter-processor communication path such that inter-processor communication is routed to the processor link controller through the router into the cores and caches; and
  operating the computer system with the socket interposer in place.

* * * * *